United States Patent
Keating et al.

(10) Patent No.: US 6,984,156 B2
(45) Date of Patent: Jan. 10, 2006

(54) CONNECTOR FOR SURFACE MOUNTING SUBASSEMBLIES VERTICALLY ON A MOTHER BOARD AND ASSEMBLIES COMPRISING THE SAME

(75) Inventors: David Keating, Limerick (IE); Antoin Russell, Limercik (IE)

(73) Assignee: Power-One Limited, Grand Cayman (KY)

( * ) Notice: Subject to any disclaimer, the term of this patent is extended or adjusted under 35 U.S.C. 154(b) by 62 days.

(21) Appl. No.: 10/715,908

(22) Filed: Nov. 18, 2003

(65) Prior Publication Data

US 2005/0042941 A1 Feb. 24, 2005

Related U.S. Application Data

(60) Provisional application No. 60/500,405, filed on Sep. 5, 2003.

(51) Int. Cl.
*H01R 4/02* (2006.01)

(52) U.S. Cl. .................................................. 439/876
(58) Field of Classification Search .................. 439/876, 439/83
See application file for complete search history.

(56) References Cited

U.S. PATENT DOCUMENTS

| | | | |
|---|---|---|---|
| 2,869,040 A | 1/1959 | Pifer | 174/261 |
| 4,978,307 A | * 12/1990 | Billman et al. | 439/83 |
| 5,455,742 A | 10/1995 | Phoy et al. | 361/778 |
| 5,490,788 A | * 2/1996 | Mazzochette | 439/83 |
| 6,072,235 A | 6/2000 | Rehnelt et al. | 257/697 |

FOREIGN PATENT DOCUMENTS

FR    2761852    10/1998

* cited by examiner

*Primary Examiner*—Javaid H. Nasri
(74) *Attorney, Agent, or Firm*—Polster, Lieder, Woodruff & Lucchesi, L.C.

(57) ABSTRACT

In accordance with the invention a surface mount connector is provided for vertically mounting one circuit device on another. By "vertically mounting" is meant that a circuit device with a major surface is mounted perpendicular to the major surface of another circuit device. The connector is a conductive body comprising a base section and a transverse section, the base section having a width greater than the transverse section and a length which extends beyond the transverse section. Advantageously, the base section extends beyond the transverse section in front, behind and on both sides. In typical use, a major surface of a subassembly can be connected to the transverse section and an edge of the subassembly can be connected to the base extensions. The base can then be connected to the mother board. With this mounting, problems of co-plurality are substantially eliminated, higher densities in the use of subassemblies can be achieved and low resistance, low inductance connection can be provided along with effective heat dissipation.

10 Claims, 1 Drawing Sheet

CONNECTOR FOR SURFACE MOUNTING SUBASSEMBLIES VERTICALLY ON A MOTHER BOARD AND ASSEMBLIES COMPRISING THE SAME

CROSS REFERENCE TO RELATED APPLICATIONS

This application claims the benefit of U.S. Provisional Application Ser. No. 60/500,405, "Connector For Surface Mounting Subassemblies Vertically On A Mother Board And Assemblies Comprising The Same", filed Sep. 5, 2003.

FIELD OF THE INVENTION

This invention relates to devices for mounting electrical devices, such as printed circuit subassemblies, to other electrical devices, such as printed circuit mother boards.

BACKGROUND OF THE INVENTION

Electronic systems are becoming faster, denser in the number of components, and increasingly complex. Increasing density typically requires greater current which, in turn, requires low resistance interconnection and effective heat dissipation. Higher speed and larger currents require low inductance. Increasing complexity often requires that subassemblies be mounted and connected onto system boards ("mother boards").

Both the subassemblies and the mother boards are typically printed circuit boards comprised of insulating substrates supporting patterns of conductive leads, mounting pads and circuit components. Such assemblies are now quickly manufactured by a surface mount technology that can precisely place components on mounting pads and efficiently connect them by solder reflow.

Surface mount assembly works well with small components. However subassemblies can be relatively large in area compared with individual components, and in connecting one printed circuit board (e.g. a subassembly) to another (e.g. the mother board) can present issues of co-planarity. If the two printed circuit boards are not sufficiently co-planar, mounting pads may not touch and solder reflow will not connect.

Accordingly, there is a need for a mounting and connection system for providing high density, low resistance, low inductance connections using surface mount technology.

SUMMARY OF THE INVENTION

In accordance with the invention a surface mount connector is provided for vertically mounting one circuit device on another. By "vertically mounting" is meant that a circuit device with a major surface is mounted perpendicular to the major surface of another circuit device. The connector is a conductive body comprising a base section and a transverse section, the base section having a width greater than the transverse section and a length which extends beyond the transverse section. Advantageously, the base section extends beyond the transverse section in front, behind and on both sides. In typical use, a major surface of a subassembly can be connected to the transverse section and an edge of the subassembly can be connected to the base extensions. The base can then be connected to the mother board. With this mounting, problems of co-plurality are substantially eliminated, higher densities in the use of subassemblies can be achieved and low resistance, low inductance connection can be provided along with effective heat dissipation.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
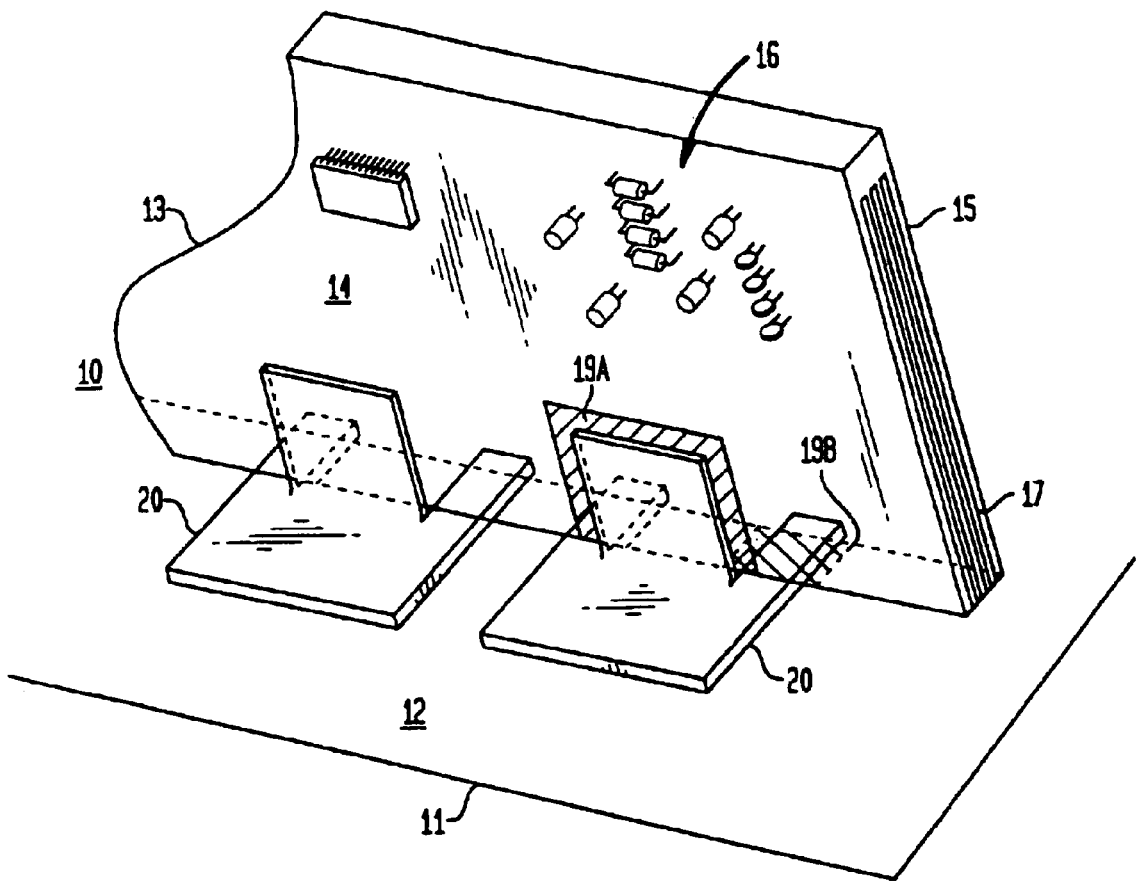
FIG. 1 is a perspective view showing a first circuit device having a second circuit device vertically connected to it.

Referring to the drawings, FIG. 1 is a perspective view of a connected circuit assembly 10 comprising a first circuit device 11 having a generally planar major surface 12 and a second circuit device 13 having a major surface 14 and edges 15. The first circuit device 11 can for example, be the system board (mother board) of the assembly, and the second circuit device 13 can be a subassembly board. Each device 11, 13 will typically comprise a printed circuit board having substantially planar major surfaces that bear mounting pads (e.g. 19A, 19B), adherent conductive leads (not shown) and a plurality of electrical components 16 such as integrated circuits, resistors, capacitors or inductors. The circuit devices are typically comprised of insulating PC boards that may include one or more internal conductive layers 17.

If the second circuit device 13 were connected to the first circuit device 11 with the major surfaces parallel, the second device 13 would occupy a relatively large area on the surface of device 11. Moreover, if the devices were printed circuit boards and were to be connected using conventional surface mount technology, co-planarity would be an issue, as mounting pads must be in contact for reliable connection by solder reflow.

Rather than connecting the devices with their major surfaces parallel, the present inventors contemplate that the second device 13 will be connected with its major surface(s) perpendicular to the major surface of device 11, and they provide connectors 20 to facilitate such perpendicular (vertical) connection compatible with surface mount fabrication of the assembly 10.

Figure 2:
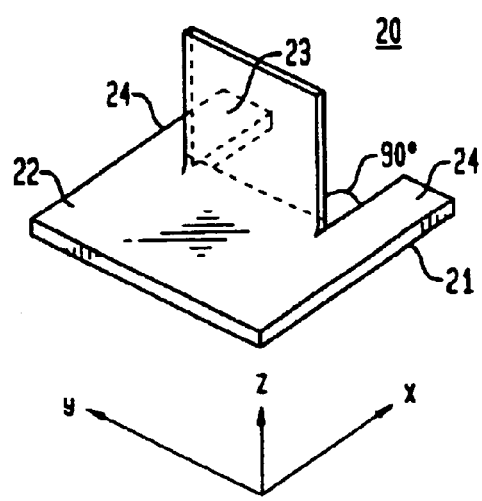
FIG. 2 is a perspective view of a connector useful for vertically connecting the second circuit device to the first.

FIG. 2 is an enlarged perspective view of the surface mount connector 20 useful for vertically connecting the second circuit device to the first. The connector 20 is composed of a conductive body 21 comprising a base section 22 and a transverse section 23.

With reference to the coordinate system shown in FIG. 2, the base section 22 can be a sheet of conductive material that is essentially planar in the xy-plane. The transverse section 23 is essentially planar in the y-z plane, substantially perpendicular to the base section. The base section 22 advantageously has a width W in the y-direction greater than the extent w of the transverse section in the y-direction so that one or more arm portions 24 of the base section extend beyond the transverse section in the x-direction. Thus the base section advantageously extends beyond the transverse section in front, behind (via arms 24) and on both sides, providing the transverse section with a firm foundation for mounting.

The connector 20 can be readily fabricated from a rectangular sheet of conductive material such as copper or copper alloy. A pair of cuts in the sheet separates the portion to become the transverse section 23 from the arms 24, and the transverse section can then be bent perpendicular to the sheet, leaving the remainder of the sheet as the base section 22. The resulting connector has arms 24 extending beyond the transverse section by a length that, in this instance, equals the height of the transverse section.

The connector is preferably provided with solderable surfaces. Copper alloys such as phosphor bronze, beryllium copper or brass are advantageously plated with a thin layer of copper, nickel or gold, followed by solder, to enhance solderability. Alternatively, the connector can be provided with a surface finish appropriate for adhesion by a thermally and electrically conductive epoxy.

The large form factors of the base and transverse sections provide paths with low inductance and low electrical and thermal resistance. Making the sections relatively thin with relatively large areas minimizes inductance and resistance.

A convenient way to fabricate the assembly of FIG. 2 is to apply one or more connectors 20 to the subassembly 13 and then to surface mount the connectors on subassembly 13 to the system board 11. The subassembly 13 can be provided with mounting pads 19A on the major surface 12 and optional mounting pads 19B on an adjacent edge 15. The connectors can be picked up and placed on the subassembly as conventional surface mount components, the transverse section serving as a vacuum nozzle pick-up point. During reflow soldering, the surface tension of the solder will draw the connectors toward the mounting pads so that the transverse section and the arms are flush with the subassembly board. Assuming the edge of the subassembly is properly finished (<0.1 mm), the subassembly 13 can then be surface mounted on the mother board by placing the connector bases onto aligned mounting pads on the system pad 11 and reflow soldering.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A surface mount connector for mounting and connecting first and second circuit devices, each device having a substantially planar major surface, the devices to be connected with their respective major surfaces substantially perpendicular, the connector comprising:
    a conductive body comprising a base section and a transverse section, the base section comprising a planar section for connecting to the major surface of the first device and the transverse section comprising a planar section substantially perpendicular to the base section for connecting to the major surface of the second circuit device;
    the base section having a width greater than the width of the transverse section and a length extending beyond the transverse section, so that the base section extends beyond the transverse section in front, behind and on both sides.

2. The surface mount connector of claim 1 wherein the second circuit device is a substantially planar circuit device having an edge perpendicular to the major surface of the second device and the base section extends beyond the transverse section on both sides to connect to the edge of the second circuit device.

3. The surface mount connector of claim 1 wherein the conductive body comprises a sheet of metal with the transverse section bent perpendicular to the base section.

4. The surface mount connector of claim 1 wherein the base section extends beyond the transverse section by a length substantially equal to the height of the transverse section.

5. The surface mount connector of claim 1 wherein the conductive body comprises a rectangular sheet of metal having a width W and a length L and the transverse section comprises a rectangular portion of the sheet of width w<W and length l<L bent substantially perpendicular to the remaining portion of the sheet.

6. The surface mount connector of claim 1 wherein the conductive body comprises copper.

7. The surface mount connector of claim 1 wherein the conductive body comprises one or more solderable surfaces.

8. A connected circuit assembly comprising:
    a first circuit device having a generally planar major surface;
    a second generally planar circuit device having a major surface and an edge, the second circuit device perpendicularly mounted on the major surface of the first device by the surface mount connector of claim 1.

9. A connected circuit assembly comprising:
    a first circuit device having a generally planar major surface;
    a second generally planar circuit device having a major surface and an edge, the second circuit device perpendicularly mounted on the major surface of the first device by the surface mount connector of claim 2.

10. A connected circuit assembly comprising:
    a first circuit device having a generally planar major surface;
    a second generally planar circuit device having a major surface and an edge, the second circuit device perpendicularly mounted on the major surface of the first device by the surface mount connector of claim 5.

* * * * *